(12) United States Patent     (10) Patent No.:   US 12,597,547 B2
Kobayashi et al.         (45) Date of Patent:     Apr. 7, 2026

---

(54) SUPERPARAMAGNETIC TUNNEL JUNCTION ELEMENT AND COMPUTING SYSTEM

(71) Applicant: TOHOKU UNIVERSITY, Sendai (JP)

(72) Inventors: Keito Kobayashi, Sendai (JP); Shun Kanai, Sendai (JP); Shunsuke Fukami, Sendai (JP); Keisuke Hayakawa, Sendai (JP); Hideo Ohno, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 42 days.

(21) Appl. No.: 18/288,132

(22) PCT Filed: Jul. 19, 2022

(86) PCT No.: PCT/JP2022/028076
      § 371 (c)(1),
      (2) Date: Oct. 24, 2023

(87) PCT Pub. No.: WO2023/017714
      PCT Pub. Date: Feb. 16, 2023

(65) Prior Publication Data
      US 2024/0212907 A1     Jun. 27, 2024

(30) Foreign Application Priority Data

Aug. 12, 2021    (JP) ................................. 2021-131508

(51) Int. Cl.
     *H01F 10/32*       (2006.01)
     *G06F 7/58*       (2006.01)
         (Continued)

(52) U.S. Cl.
     CPC ......... *H01F 10/3277* (2013.01); *G06F 7/588* (2013.01); *H10N 15/20* (2023.02);
         (Continued)

(58) Field of Classification Search
     CPC ................................................... H01F 10/3277
         (Continued)

(56) References Cited

U.S. PATENT DOCUMENTS

2002/0191451 A1   12/2002   Kishi et al.
2011/0133298 A1*   6/2011   Chen ...................... H10N 50/01
                                         257/E43.001

(Continued)

FOREIGN PATENT DOCUMENTS

JP        2019-144812 A     8/2019
KR    10-2017-0057112 A     5/2017

(Continued)

OTHER PUBLICATIONS

Camsari et al.; "Stochastic p-Bits for Invertible Logic;" Physical Review X; 2017; pp. 031014-1-031014-19; vol. 031014.

(Continued)

*Primary Examiner* — Tomi Skibinski
(74) *Attorney, Agent, or Firm* — Oliff PLC

(57) ABSTRACT

A superparamagnetic tunnel junction element and a computing system using same, wherein the tunnel junction element has excellent operational stability against an external magnetic field and is suitable for the computing system based on probabilistic computing. The superparamagnetic tunnel junction element includes a first ferromagnetic layer group containing a ferromagnetic material, a second ferromagnetic layer group containing a ferromagnetic material, and a barrier layer disposed between the first ferromagnetic layer group and the second ferromagnetic layer group, wherein the first ferromagnetic layer group 14 includes a (1-1)th ferromagnetic layer, a (1-2)th ferromagnetic layer, and a first nonmagnetic coupling layer, the (1-1)th ferromagnetic layer is made of a ferromagnetic material, the magnetization direction thereof changes with a first time (Continued)

constant, the first time constant is one second or shorter, and the first nonmagnetic coupling layer contains at least one of Ru, Ir, Rh, Cr, and Cu.

10 Claims, 5 Drawing Sheets

(51) Int. Cl.
*H10N 15/20* (2023.01)
*H10N 50/20* (2023.01)
*H10N 50/85* (2023.01)
(52) U.S. Cl.
CPC ............. *H10N 50/20* (2023.02); *H10N 50/85* (2023.02); *H01F 10/3259* (2013.01)
(58) Field of Classification Search
USPC ......................................................... 327/164
See application file for complete search history.

(56) References Cited

U.S. PATENT DOCUMENTS

| | | | | |
|---|---|---|---|---|
| 2013/0107616 A1* | 5/2013 | Ohno | ..................... | H10N 50/10 |
| | | | | 365/158 |
| 2020/0106001 A1 | 4/2020 | Gupta et al. | | |
| 2022/0350572 A1 | 11/2022 | Fukami et al. | | |

FOREIGN PATENT DOCUMENTS

| | | | |
|---|---|---|---|
| KR | 10-2018-0104539 A | 9/2018 | |
| TW | 200713648 A | 4/2007 | |
| WO | 2006/104002 A1 | 10/2006 | |
| WO | 2007/035786 A2 | 3/2007 | |
| WO | 2012/004883 A1 | 1/2012 | |
| WO | WO-2021002115 A1 * | 1/2021 | ............... G06F 7/58 |

OTHER PUBLICATIONS

Camsari et al.; "Implementing p-bits With Embedded MTJ;" IEEE Electron Device Letters; 2017; pp. 1767-1770; vol. 38, No. 12.

Lv et al.; "A single magnetic-tunnel-junction stochastic computing unit;" 2017 IEEE International Electron Devices Meeting (IEDM); 2017; 36.2.1-36.2.4.
Bapna et al.; "Current control of time-averaged magnetization in superparamagnetic tunnel junctions;" Appl. Phys. Lett.; 2017; pp. 243107-1-243107-4; vol. 111, No. 243107.
Mizrahi et al.; "Neural-like computing with populations of superparamagnetic basis functions;" Nature Communications; 2018; pp. 1-11; vol. 9, No. 1533.
Zink et al.; "Telegraphic switching signals by magnet tunnel junctions for neural spiking signals with high information capacity;" J. Appl. Phys.; 2018; pp. 152121-1-152121-5; vol. 124, No. 152121.
Parks et al.; "Superparamagnetic perpendicular magnetic tunnel junctions for true random number generators;" AIP Advances; 2018; pp. 055903-1-055903-5; vol. 8, No. 055903.
Hayakawa et al.; "Nanosecond Random Telegraph Noise in In-Plane Magnetic Tunnel Junctions;" Physical Reviewer Letters; 2021; pp. 117202-1-117202-6; vol. 126, No. 117202.
Borders et al.; "Integer factorization using stochastic magnetic tunnel junctions;" Nature; 2019; pp. 390-406; vol. 573.
Rippard et al.; "Thermal relaxation rates of magnetic nanoparticles in the presence of magnetic fields and spin-transfer effects;" Physical Review B; 2011; pp. 064439-1-064439-7; vol. 84, No. 064439.
Camsari et al.; "Double-Free-Layer Magnetic Tunnel Junctions for Probabilistic Bits;" Physical Review Applied; 2021; pp. 044049-1-044049-10; vol. 15, No. 044049.
Oct. 18, 2022 Search Report issued in International Patent Application No. PCT/JP2022/028076.
Oct. 18, 2022 Written Opinion of the International Searching Authority issued in International Patent Application No. PCT/JP2022/028076.
Camsari, Kerem Y. et al. "Double Free-Layer Magnetic Tunnel Junctions for Probabilistic Bits." Physical Review Applied. vol. 15, No. 4, 9 pages, 2020.
Oct. 15, 2024 Extended Search Report issued in European Patent Application No. 22855778.1.
Oct. 27, 2025 Office Action issued in Taiwanese Patent Application No. 111128364.
Dec. 8, 2025 Office Action issued in Korean Patent Application No. 10-2023-7031566.

* cited by examiner

<u>1</u>

(a)

(b)

(a)                                      (b)

14

14A_2

14B_1

14A_1

Z

Y⊗  X (a)   14   14A_1

(b)   14   14A_2
           14B_1
           14A_1

Z

Y⊗  X (a)

(b)

(a)
<u>10</u>

(b)
<u>10</u>

<u>10</u>

SUPERPARAMAGNETIC TUNNEL JUNCTION ELEMENT AND COMPUTING SYSTEM

FIELD OF THE INVENTION

The present invention relates to a superparamagnetic tunnel junction element and a computing system using the same.

DESCRIPTION OF RELATED ART

Conventional computing systems can efficiently handle iterative large-scale problems such as four arithmetic operations but are weak at handling problems with high computational complexity such as of optimization problems. In recent years, probabilistic computing, along with quantum computing, has attracted attention as computational principle that can easily handle complex processing that the conventional computing systems are weak at. The development of the computing system hardware specialized for probabilistic computing has become an important issue.

A computing system specialized for probabilistic computing requires a random number generation unit whose output changes randomly over time between 0 and 1 and whose output ratio of 0 and 1 can be controlled by an external input current (or voltage). The random number generation unit requires a circuit or a solid-state element capable of generating a random output signal.

In recent years, a magnetic tunnel junction element has attracted attention as a solid-state element that can generate a random output signal. A magnetic tunnel junction element typically includes a first ferromagnetic layer group made of a ferromagnetic material, a second ferromagnetic layer group also made of a ferromagnetic material, and a barrier layer made of an insulator formed between the first ferromagnetic layer group and the second ferromagnetic layer group. For example, when the magnetization direction of the first ferromagnetic layer group is designed to be freely reversed, and the magnetization direction of the second ferromagnetic layer group is designed to be substantially fixed, by utilizing the tunnel magnetoresistance effect, the direction of magnetization of the first ferromagnetic layer group can be detected by the level of electrical resistance, so that the magnetic tunnel junction element can be used for assigning information to 0 and 1. In this case, the first ferromagnetic layer group is also called a free layer, and the second ferromagnetic layer group is also called a fixed layer.

A magnetic tunnel junction element can be applied as a storage element of a nonvolatile memory by designing the magnetic tunnel junction element so that the magnetization direction of the free layer does not easily change in response to thermal disturbance. On the other hand, when the magnetic tunnel junction element is designed so that the direction of magnetization changes easily in response to thermal disturbance, the magnetic tunnel junction element can be applied to computing systems that perform probabilistic computing as a solid-state element that generates a random output signal. The stability of the magnetization direction against thermal disturbance is called thermal stability, and is quantitatively represented using a thermal stability index, which is a value obtained by dividing the energy barrier E between two states by thermal disturbance $k_BT$ ($E/k_BT$). A state in which the magnetization direction fluctuates with a short time constant due to thermal disturbance is called superparamagnetism, and magnetic tunnel junction elements designed so that the free layer exhibits superparamagnetism are called superparamagnetic tunnel junction elements.

Conventionally, as an application of magnetic tunnel junction elements to probabilistic computing, there is proposed a method for realizing probabilistic computing in which numerical calculations are performed assuming a hypothetical magnetic tunnel junction element designed so that the free layer has a thermal stability index of 0 (see, for example, Non-Patent Literature 1 or Non-Patent Literature 2). Further, the experimental results on superparamagnetic tunnel junction elements are also disclosed (see, for example, Non-Patent Literatures 3 to 8). In addition to the experimental results on superparamagnetic tunnel junction elements, the results of proof of principle of probabilistic computing using the same are also disclosed (see, for example, Non-Patent Literature 9).

Note that the physical definition of the time constant $\tau$ representing the frequency of temporal fluctuations in the magnetization direction of the magnetic tunnel junction elements are disclosed (for example, Non-Patent Literature 10). Further, the results showing that superparamagnetic tunnel junction elements designed so that both the first ferromagnetic layer group and the second ferromagnetic layer group exhibit superparamagnetism exhibit properties suitable for probabilistic computing are also disclosed (see, for example, Non-Patent Literature 11).

CITATION LIST

Non-Patent Literature 1: Kerem Yunus Camsari, Rafatul Faria, Brian M. Sutton, and Supriyo Datta, "Stochastic p-Bits for Invertible Logic", Phys. Rev. X, 2017, vol. 7, 031014

Non-Patent Literature 2: Kerem Yunus Camsari, Sayeef Salahuddin, Supriyo Datta, "Implementing p-bits With Embedded MTJ", IEEE Electron Device Letters, 2017, vol. 38, 1767

Non-Patent Literature 3: Yang Lv, Jian-Ping Wang, "A single magnetic-tunnel-junction stochastic computing unit", 2017 IEEE International Electron Devices Meeting (IEDM), 2017, DOI: 10.1109/IEDM. 2017.8268504

Non-Patent Literature 4: Mukund Bapna and Sara A. Majetich, "Current control of time-averaged magnetization in superparamagnetic tunnel junctions", Appl. Phys. Lett., 2017, vol. 111, 243107

Non-Patent Literature 5: Alice Mizrahi, Tifenn Hirtzlin, Akio Fukushima, Hitoshi Kubota, Shinji Yuasa, Julie Grollier & Damien Querlioz, "Neural-like computing with populations of superparamagnetic basis functions", Nature Communications, 2018, vol. 9, 1533

Non-Patent Literature 6: Brandon R. Zink, Yang Lv, and Jian-Ping Wang, "Telegraphic switching signals by magnet tunnel junctions for neural spiking signals with high information capacity", J. Appl. Phys., 2018, vol. 124, 152121

Non-Patent Literature 7: Bradley Parks, Mukund Bapna, Julianne Igbokwe, Hamid Almasi, Weigang Wang, and Sara A. Majetich, "Superparamagnetic perpendicular magnetic tunnel junctions for true random number generators", AIP Advances, 2018, vol. 8, 055903

Non-Patent Literature 8: Keisuke Hayakawa, Shun Kanai, Takuya Funatsu, Junta Igarashi, Butsurin Jinnai, William Andrew Borders, Hideo Ohno, and Shunsuke Fukami, "Nanosecond Random Telegraph Noise in In-Plane Magnetic Tunnel Junctions," Physical Reviewer Letters, 2021, vol. 126, 117202

Non-Patent Literature 9: William A. Borders, Ahmed Z. Pervaiz, Shunsuke Fukami, Kerem Y Camsari, Hideo Ohno & Supriyo Datta, "Integer factorization using stochastic magnetic tunnel junctions," Nature, 2019, vol. 573, pp. 390-393

Non-Patent Literature 10: William Rippard, Ranko Heindl, Matthew Pufall, Stephen Russek, and Anthony Kos, "Thermal relaxation rates of magnetic nanoparticles in the presence of magnetic fields and spin-transfer effects", Physical Review B, 2011, vol. 84, 064439

Non-Patent Literature 11: Kerem. Y. Camsari, Mustafa Mert Tarunbalci, William A. Borders, Hideo Ohno, and Shunsuke Fukami "Double-Free-Layer Magnetic Tunnel Junctions for Probabilistic Bits", Physical Review Applied, 2021, vol. 15, 044049

SUMMARY OF THE INVENTION

One of the challenges for the social implementation of computing systems using superparamagnetic tunnel junction elements is operational stability (robustness) against an external magnetic field. In environments where computing systems are used, it is expected that a magnetic field of up to several millitesla to several tens of millitesla will be applied due to various external factors. However, superparamagnetic tunnel junction elements are required to operate stably without significantly changing the properties even in the presence of an external magnetic field.

Overcoming this problem is not easy because the free layer of a superparamagnetic tunnel junction element is designed to have a small anisotropic magnetic field and therefore generally reacts sensitively to an external magnetic field. For example, the superparamagnetic tunnel junction element disclosed in Non-Patent Literature 4 and Non-Patent Literature 8 changes from a state in which 0 is continuously output to a state in which 1 is continuously output regardless of time when the applied magnetic field changes by only approximately 1 millitesla. Such restrictions on a disturbance magnetic field are undesirable factors in terms of applications, such as significantly limiting the applications in which computing systems using superparamagnetic tunnel junction elements can be used, or requiring large and costly magnetic field shields. Non-Patent Literatures 3, 5 to 7, and 9 do not clearly indicate the dependence of properties on an external magnetic field, but they have the same problems as Non-Patent Literatures 4 and 8.

The present invention has been made with attention to such problems, and an object thereof is to provide a superparamagnetic tunnel junction element that has excellent operational stability (robustness) against an external magnetic field and is suitable for computing systems based on probabilistic computing, and a computing system using the same.

In order to achieve the above object, a superparamagnetic tunnel junction element according to the present invention includes a first ferromagnetic layer group containing a ferromagnetic material; a second ferromagnetic layer group containing a ferromagnetic material; and a barrier layer disposed between the first ferromagnetic layer group and the second ferromagnetic layer group, wherein the first ferromagnetic layer group has a (1-1)th ferromagnetic layer, a first nonmagnetic coupling layer, and a (1-2)th ferromagnetic layer, the (1-1)th ferromagnetic layer is made of a ferromagnetic material, and a magnetization direction thereof changes with a first time constant, and the first time constant is 1 second or less, and the first nonmagnetic coupling layer contains at least one of Ru, Ir, Rh, Cr and Cu.

Alternatively, the superparamagnetic tunnel junction element according to the present invention may include a first ferromagnetic layer group containing a ferromagnetic material; a second ferromagnetic layer group containing a ferromagnetic material; and a barrier layer disposed between the first ferromagnetic layer group and the second ferromagnetic layer group; the first ferromagnetic layer group has a (1-1)th ferromagnetic layer, a first nonmagnetic coupling layer, and a (1-2)th ferromagnetic layer, the (1-1)th ferromagnetic layer is made of a ferromagnetic material, a magnetization direction thereof changes with a first time constant, the first time constant is 1 second or less, and the magnetizations of the (1-1)th ferromagnetic layer and the (1-2)th ferromagnetic layer are coupled by the first nonmagnetic coupling layer so as to be stable in approximately antiparallel directions.

In the superparamagnetic tunnel junction element according to the present invention, the first nonmagnetic coupling layer contains at least one of Ru, Ir, Rh, Cr, and Cu, or the magnetizations of the (1-1)th ferromagnetic layer and the (1-2)th ferromagnetic layer are coupled by the first nonmagnetic coupling layer so as to be stable in approximately antiparallel directions. Thus, the superparamagnetic tunnel junction element has excellent operational stability (robustness) against an external magnetic field. Therefore, the superparamagnetic tunnel junction element according to the present invention is suitable for a computing system based on probabilistic computing.

In the superparamagnetic tunnel junction element according to the present invention, the second ferromagnetic layer group may have at least a (2-1)th ferromagnetic layer, the (2-1)th ferromagnetic layer may be made of a ferromagnetic material, and a magnetization direction thereof may be substantially fixed.

Further, in the superparamagnetic tunnel junction element according to the present invention, the second ferromagnetic layer group may have at least a (2-1)th ferromagnetic layer, the (2-1)th ferromagnetic layer may be made of a ferromagnetic material, a magnetization direction may change with a second time constant, and the second time constant is 1 second or less. In this case, the second ferromagnetic layer group may further have a second nonmagnetic coupling layer and a (2-2)th ferromagnetic layer, and the second nonmagnetic coupling layer may contain at least one of Ru, Ir, Rh, Cr, and Cu. Alternatively, the second ferromagnetic layer group may further have a second nonmagnetic coupling layer and a (2-2)th ferromagnetic layer, and the magnetizations of the (2-1)th ferromagnetic layer and the (2-2)th ferromagnetic layer may be coupled by the second nonmagnetic coupling layer so as to be stable in approximately antiparallel directions.

In the superparamagnetic tunnel junction element according to the present invention, a film thickness of the first nonmagnetic coupling layer may be in a range of 0.5 nm to 1.1 nm or 1.7 nm to 2.5 nm. Further, in the superparamagnetic tunnel junction element according to the present invention, the first ferromagnetic layer group may have a circular or elliptical shape, a ratio of a major axis to a minor axis may be 1 or more and 3 or less, and the minor axis may be 80 nanometers or less.

In the superparamagnetic tunnel junction element according to the present invention, a value obtained by dividing an average magnetic volume [tesla cubic meter] of the (1-1)th ferromagnetic layer and the (1-2)th ferromagnetic layer by a coupling strength [tesla] of the first nonmagnetic coupling layer is preferably $2.5 \times 10^{-23}$ [cubic meters] or less, more preferably $1 \times 10^{-23}$ [cubic meters] or less. In addition, the coupling strength [tesla] of the first nonmagnetic coupling layer is preferably 1 [tesla] or less.

A computing system according to the present invention includes a weighed logic; a plurality of random number generation units connected by the weighed logic; and an output circuit, wherein each random number generation unit has the superparamagnetic tunnel junction element according to the present invention.

Since the computing system according to the present invention includes the superparamagnetic tunnel junction element according to the present invention, the computing system has excellent operational stability (robustness) against an external magnetic field.

According to the present invention, it is possible to provide a superparamagnetic tunnel junction element and a computing system using same, the tunnel junction element having excellent operational stability (robustness) against an external magnetic field and being suitable for the computing system based on probabilistic computing.

DETAILED DESCRIPTION OF THE INVENTION

A superparamagnetic tunnel junction element according to an embodiment of the present invention and a computing system using the same will be explained below with reference to the drawings.

1. Basic Structure of Computing System

Figure 1:
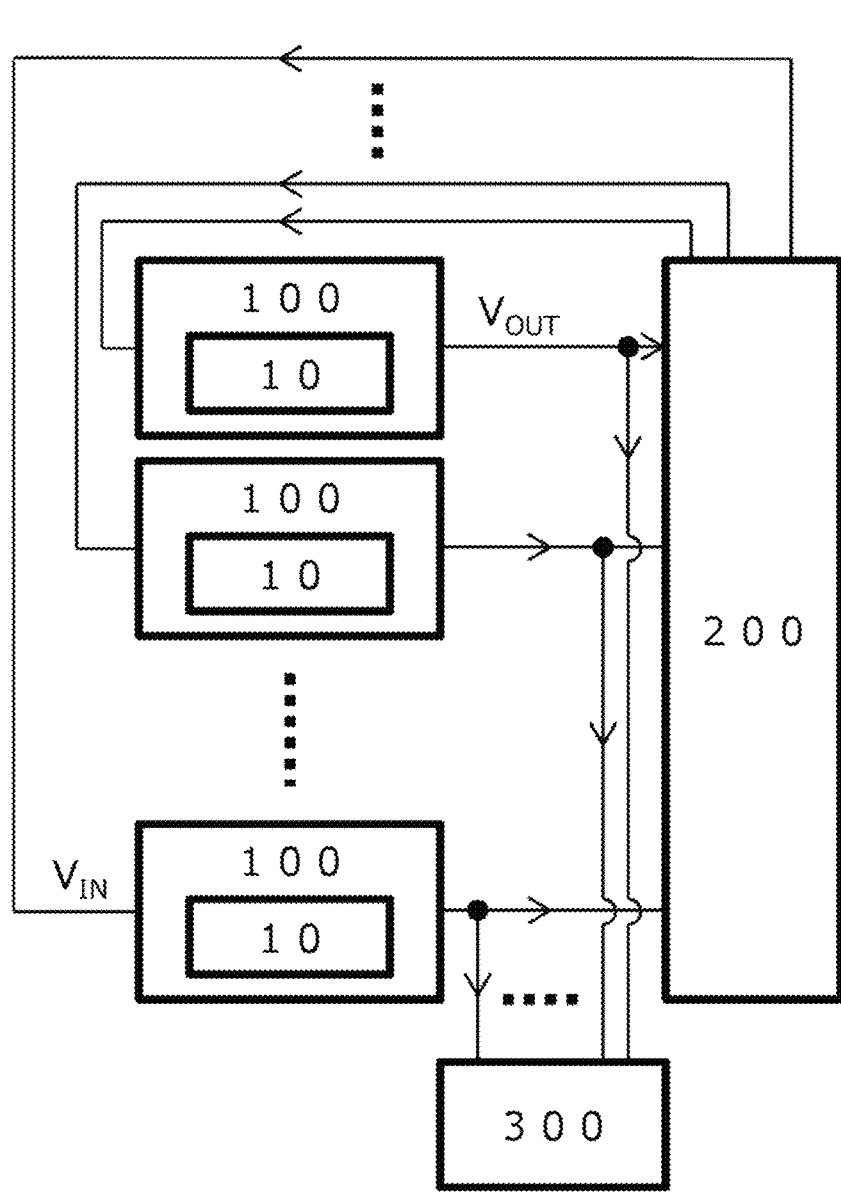
FIG. 1 is a block diagram showing a computing system according to an embodiment of the present invention.

FIG. 1 shows a block diagram of a computing system 1 according to an embodiment of the present invention. The computing system 1 according to the embodiment of the present invention includes a weighted logic 200, a plurality of random number generation units 100 connected by the weighed logic 200, and an output circuit 300. The random number generation unit 100 includes at least one superparamagnetic tunnel junction element 10.

In probabilistic computing, the energy (cost function) for solving a given problem is set mathematically, and the size of the input signal that should be introduced into each bit to minimize the energy (cost function) is explained as a function of the states of the other bits. This function is programmed into weighed logic 200.

An input signal $V_{IN}$ is input to the random number generation unit 100, and an output signal $V_{OUT}$ is output from the random number generation unit 100. The random number generation unit 100 generates an output signal $V_{OUT}$ that changes from time to time with a first time constant $\tau 1$, but its time-averaged properties change in a sigmoidal manner with respect to the input signal $V_{IN}$.

The weighed logic 200 calculates an input signal $V_{IN}$ to each random number generation unit 100 at any time according to an output signal $V_{OUT}$ from each random number generation unit 100 that changes from time to time, and feeds it back to each random number generation unit 100. This loop continues for a certain time $T_{COMP}$.

The output circuit 300 continues to measure the output signal $V_{OUT}$ from each random number generation unit 100 that changes from time to time, and accumulates a solution corresponding to the output signal $V_{OUT}$ from each random number generation unit 100 at each time for a certain time $T_{COMP}$. The time $T_{COMP}$ is preferably 1000 times or more the first time constant $\tau 1$, although it depends on the scale and nature of the problem and the accuracy of the solution to be obtained. As a result, in the case of an optimization problem, the optimum solution is obtained as the most frequently observed state. In the case of a sampling problem, the state distribution itself becomes a sample solution corresponding to a given problem.

2. Basic Structure of Superparamagnetic Tunnel Junction (First Embodiment)

Figure 2:
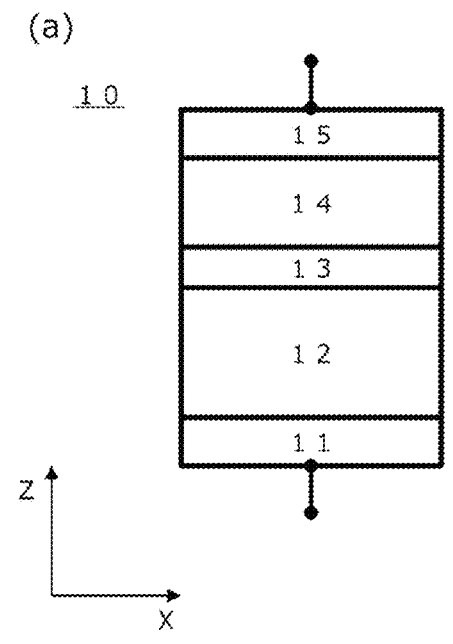
FIG. 2 includes (a) an X-Z sectional view and (b) an X-Y plan view of a superparamagnetic tunnel junction element according to a first embodiment of the present invention.
Figure 2:
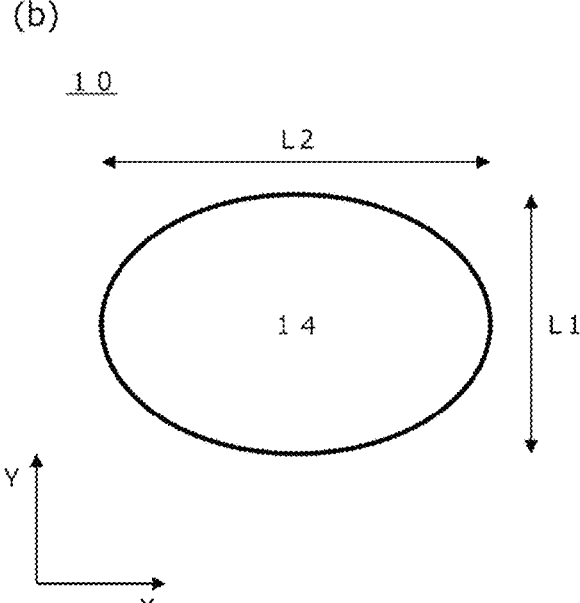

FIG. 2 schematically shows the structure of the superparamagnetic tunnel junction element 10 according to the first embodiment of the present invention. FIG. 2(*a*) is an X-Z sectional view, and FIG. 2(*b*) is an X-Y plan view. The superparamagnetic tunnel junction element 10 shown in FIG. 2 has two terminals, upper and lower terminals. The circuit configuration of the random number generation unit 100 for performing probabilistic computing using the superparamagnetic tunnel junction element 10 having such a two-terminal structure is disclosed, for example, in Non-Patent Literature 2, and the explanations thereof will be omitted here.

The superparamagnetic tunnel junction element 10 includes a lower electrode 11, a second ferromagnetic layer group 12 provided adjacent to the upper surface of the lower electrode 11, a barrier layer 13 provided adjacent to the upper surface of the second ferromagnetic layer group 12, a first ferromagnetic layer group 14 provided adjacent to the upper surface of the barrier layer 13, and an upper electrode 15 provided adjacent to the upper surface of the first ferromagnetic layer group 14. Note that the order of the first ferromagnetic layer group 14 and the second ferromagnetic layer group 12 may be reversed.

In the first embodiment, the second ferromagnetic layer group 12 contains a ferromagnetic material and its magnetization direction is substantially fixed. The barrier layer 13 is made of an insulator. The first ferromagnetic layer group 14 is composed of a laminated structure including a ferromagnetic material, and the magnetization direction of at least a portion thereof freely changes with a first time constant τ1 due to thermal disturbance. The specific laminated structure will be explained in detail later. Preferably, both the second ferromagnetic layer group 12 and the first ferromagnetic layer group 14 have an easy axis of magnetization (in-plane easy axis of magnetization) in the film in-plane direction. However, both of them may have an easy axis of magnetization (perpendicular easy axis of magnetization) in the direction perpendicular to the film surface.

The lower electrode 11 and the upper electrode 15 are made of a metallic material. The lower electrode 11 and upper electrode 15 are electrically connected to the wiring shown in the figure.

The first time constant τ1 must be sufficiently shorter than the certain time $T_{COMP}$. Although the ratio depends on the scale of the problem and the accuracy of the solution to be obtained, τ1 is 1/1000 or less of $T_{COMP}$, preferably 1 second or less.

The superparamagnetic tunnel junction element 10 has an elliptical shape in the film plane, with a minor axis of L1 and a major axis of L2. Alternatively, at least the first ferromagnetic layer group 14 has an elliptical shape in the film plane, with a minor axis of L1 and a major axis of L2. A suitable design range for the minor axis L1 and the major axis L2 will be explained later.

Figure 3:
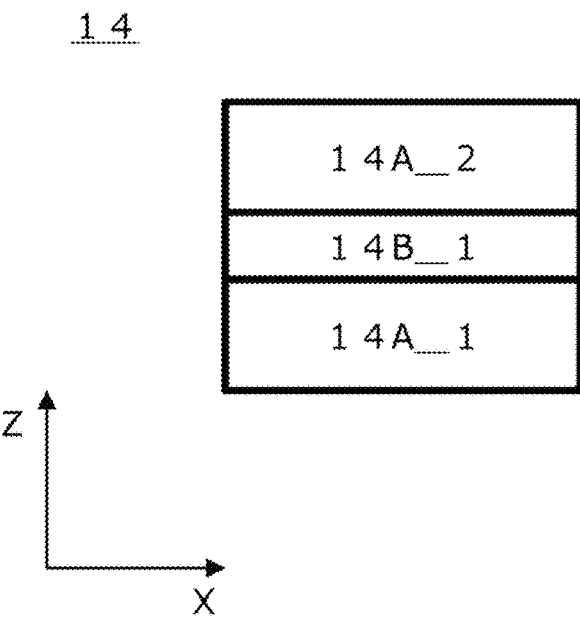
FIG. 3 is an X-Z sectional view schematically showing the laminated structure of the first ferromagnetic layer group of the superparamagnetic tunnel junction element according to the first embodiment of the present invention.

FIG. 3 is an X-Z sectional view showing the laminated structure of the first ferromagnetic layer group 14. The first ferromagnetic layer group 14 of the superparamagnetic tunnel junction element 10 according to the first embodiment of the present has a structure in which a (1-1)th ferromagnetic layer 14A_1, a first nonmagnetic coupling layer 14B_1, a (1-2)th ferromagnetic layer 14A_2 are laminated in this order or in a reverse order. The (1-1)th ferromagnetic layer 14A_1 and the (1-2)th ferromagnetic layer 14A_2 are made of a ferromagnetic material, and the first nonmagnetic coupling layer 14B_1 is composed of a nonmagnetic material. The (1-1)th ferromagnetic layer 14A_1 is adjacent to the barrier layer 13, and the magnetization direction of at least the (1-1)th ferromagnetic layer 14A_1 must be freely changed with the first time constant τ1 by thermal disturbance.

Figure 4:
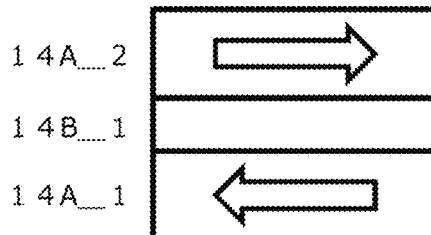
FIG. 4 is an X-Z sectional view schematically showing a stable magnetization state of the first ferromagnetic layer group of the superparamagnetic tunnel junction element according to the first embodiment of the present invention, in which (a) corresponds to when the (1-1)th ferromagnetic layer is oriented in the −x direction, (b) corresponds to when the (1-1)th ferromagnetic layer is oriented in the +x direction.
Figure 4:
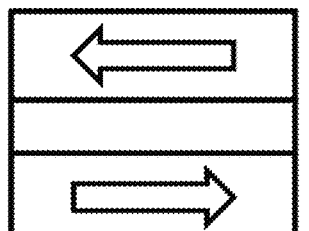

FIG. 4 schematically shows typical examples of possible directions of magnetization of the (1-1)th ferromagnetic layer 14A_1 and the (1-2)th ferromagnetic layer 14A_2. In the present invention, the magnetizations of the (1-1)th ferromagnetic layer 14A_1 and the (1-2)th ferromagnetic layer 14A_2 are coupled in approximately antiparallel directions via the first nonmagnetic coupling layer 14B_1. Ruderman-Kittel-Kasuya-Yosida (RKKY) interaction and the like can be used as the principle of magnetic coupling. As shown in FIG. 4, when the (1-1)th ferromagnetic layer 14A_1 is oriented in the −x direction, the (1-2)th ferromagnetic layer 14A_2 is stable in the +x direction, and when the (1-1)th ferromagnetic layer 14A_1 is oriented in the +x direction, the (1-2)th ferromagnetic layer 14A_2 is stable in the −x direction. The magnetization state shown here is a schematic representation of the configuration in a thermally stable state. During operation, the mutual magnetization may temporarily deviate from the ±x direction, and there are moments where the mutual magnetization deviates from the antiparallel state. In addition, the ratio of the magnetic volumes ($M_st$) per unit area given by the product of the saturation magnetizations ($M_S$) and the effective film thicknesses (t) of the (1-1)th ferromagnetic layer 14A_1 and the (1-2)th ferromagnetic layer 14A_2 is preferably designed to be 20% or less, more preferably 10% or less. This makes it easier to obtain the effects of the present invention. The principle will be explained later.

Although the second ferromagnetic layer group 12 is depicted as being composed of a single ferromagnetic layer in FIG. 2. In reality, the second ferromagnetic layer group 12 also preferably has a laminated structure composed of a plurality of layers. In particular, it is preferable that the second ferromagnetic layer group 12 is composed of two ferromagnetic layers antiferromagnetically coupled by a pinning layer made of an antiferromagnetic material and a nonmagnetic layer. These are the same structures as those employed in general nonvolatile magnetic memories, and so detailed explanations will be omitted.

In addition, FIGS. 3 and 4 show the first ferromagnetic layer group 14 having a structure in which the (1-1)th ferromagnetic layer 14A_1 and the (1-2)th ferromagnetic layer 14A_2 are antiferromagnetically coupled via the first nonmagnetic coupling layer 14B_1. However, for example, the number of layers may be further increased to employ a structure in which a (1-1)th ferromagnetic layer 14A_1, a (1-1)th nonmagnetic coupling layer 14B_1, a (1-2)th ferromagnetic layer 14A_2, a (1-2)th nonmagnetic coupling layer 14B_2, a (1-3)th ferromagnetic layer 14A_3, . . . , a (1-N)th nonmagnetic coupling layer 14B_N, and (1-N+1)th ferromagnetic layer 14A_N+1 are laminated in this order. The magnetizations of the ferromagnetic layers facing each other via each nonmagnetic coupling layer may be coupled in an antiparallel direction.

3. Principle

Next, the principle of realizing the superparamagnetic tunnel junction element 10 with excellent resistance against an external magnetic field according to the present invention will be explained using FIG. 5. For the purpose of explanation, the conventional structure (FIG. 5(a)) in which the first ferromagnetic layer group 14 is composed of a single ferromagnetic layer and the structure of the present invention (FIG. 5(b)) in which the first ferromagnetic layer group 14 is composed of the (1-1)th ferromagnetic layer 14A_1 and the (1-2)th ferromagnetic layer 14A_2 that are antiferromagnetically coupled are shown. The left half of the figure is a schematic diagram of the film structure and magnetization direction, and the right half schematically shows the response of the time-averaged magnetization <M> when an external magnetic field H is applied, and the most stable state (outlined arrow) of magnetization at that time. Here, for the sake of simplicity, it is assumed that the magnetic volumes ($M_S t$) of the (1-1)th ferromagnetic layer 14A_1 and the (1-2)th ferromagnetic layer 14A_2 are equal and completely cancelled.

Figure 5:
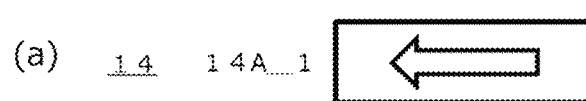
FIG. 5 is a schematic diagram for explaining the principle by which desired properties are obtained in (a) the structure of a conventional superparamagnetic tunnel junction element and (b) the structure of the superparamagnetic tunnel junction element of the first embodiment of the present invention, in which the left figure shows a film structure and a magnetization direction and the right figure shows a response of the time-averaged magnetization <M> when an external magnetic field H is applied, and the most stable state of magnetization at that time.
Figure 5:
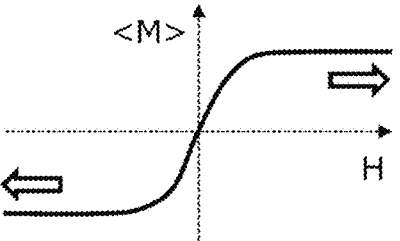
Figure 5:
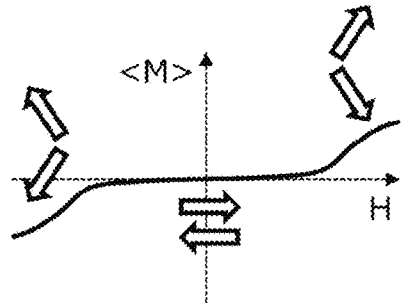

In the case of a single ferromagnetic layer (FIG. 5(*a*)), for example, when a magnetic field is applied in the +x direction, the magnetization is oriented in the +x direction and the Zeeman energy decreases, so the magnetization is easily oriented in the +x direction. Conversely, when a magnetic field is applied in the −x direction, the magnetization is oriented in the −x direction, the Zeeman energy decreases, so the magnetization is easily oriented in the −x direction. Therefore, even if the magnetization fluctuates superparamagnetically in terms of time resolution, the time-averaged magnetization <M> changes like a sigmoidal function with respect to the magnetic field, as shown in the right figure. Since the magnetic tunnel junction element is in a low resistance state or a high resistance state depending on the magnetization direction, the magnetic field dependence of the time-average magnetization <M> is directly reflected in the resistance of the superparamagnetic tunnel junction element 10 and the output signal $V_{OUT}$ from the random number generation unit 100.

On the other hand, in the superparamagnetic tunnel junction element using artificial antiferromagnetic coupling according to the first embodiment of the present invention (FIG. 5(*b*)), even if the magnetic field is applied in the +x direction or in the −x direction, since the magnetizations of the (1-1)th ferromagnetic layer 14A_1 and (1-2)th ferromagnetic layer 14A_2 are coupled in the antiparallel direction, if one of the ferromagnetic layers is oriented the direction of the magnetic field, the other ferromagnetic layer prevents that change. Therefore, within a certain magnetic field range, the time-averaged magnetization <M> does not change significantly with magnetic field. Above a certain magnetic field (flop magnetic field), a state in which the magnetizations of the (1-1)th ferromagnetic layer 14A_1 and the (1-2)th ferromagnetic layer 14A_2 have an intermediate angle between 0 and 180 degrees like scissors becomes stable, and the average magnetization <M> changes following the magnetic field such that the scissors are closed as the magnetic field increases. Thus, as shown in the right figure of FIG. 5(*b*), a state in which the average magnetization <M> does not significantly respond to the magnetic field over a wide magnetic field range is achieved. That is, a superparamagnetic tunnel junction element that is robust against an external magnetic field is realized.

Next, a case where a magnetic field is applied in the y-direction or the z-direction will be considered. At this time, in the case of a single ferromagnetic layer (FIG. 5(*a*)), since the energy barrier for reversal is reduced or pushed up to a high energy state, the time constant τ1 of fluctuations of magnetization is shortened. On the other hand, when artificial antiferromagnetic coupling is used (FIG. 5(*b*)), even if the magnetization of one ferromagnetic layer is oriented in the direction of the magnetic field, since the other ferromagnetic layer prevents that change, the effect of application of an external magnetic field is suppressed. Therefore, similarly to the case of the magnetic field in the x-direction, robust behavior against an external magnetic field is achieved.

4. Material and Shape

Next, materials that can be used for each layer of the superparamagnetic tunnel junction element 10 according to the first embodiment of the present invention will be explained. For the lower electrode 11 and the upper electrode 15, a nonmagnetic and conductive metal can be used. Specifically, Ta, W, Ti, Ru, Cu, Cu—N, Ti—N, Ta—N, and the like are exemplified. The film thickness is designed to be in the range of approximately 5 nanometers to 80 nanometers.

Typically, the second ferromagnetic layer group 12 preferably has a laminated structure in which a pinning layer made of an antiferromagnetic material, a (2-1)th ferromagnetic fixed layer made of a ferromagnetic material, a fixed layer coupling layer made of a nonmagnetic material, and a (2-1)th ferromagnetic fixed layer made of a ferromagnetic material are laminated in this order from the substrate side. Here, the (2-1)th ferromagnetic fixed layer and the (2-2)th ferromagnetic fixed layer are coupled in an antiparallel direction via the fixed layer coupling layer.

A Pt—Mn alloy, an Ir—Mn alloy, a Pd—Mn alloy, and the like can be used for the pinning layer. The film thickness is designed to be in the range of approximately 5 nanometers to 30 nanometers. Co, Fe, Co—Fe alloy, and the like can be used for the (2-1)th ferromagnetic fixed layer. The film thickness is designed to be in the range of approximately 1 nanometer to 4 nanometers. Ru and the like can be used for the fixed layer coupling layer. The film thickness is designed to be in the range of approximately 0.6 nanometers to 2.5 nanometers. A Co—Fe—B alloy, a Fe—B alloy, and the like can be used for the (2-2)th ferromagnetic fixed layer. The film thickness is designed to be in the range of approximately 1 nanometer to 4 nanometers.

An insulating nonmagnetic material can be used for the barrier layer 13. In particular, it is preferable to use MgO. The film thickness is designed to be approximately 0.8 nanometers to 2.0 nanometers.

The (1-1)th ferromagnetic layer 14A_1 and the (1-2)th ferromagnetic layer 14A_2 constituting the first ferromagnetic layer group 14 can be made of a Co—Fe—B alloy, an Fe—B alloy, a Co—Fe alloy, and the like. In either case, the film thickness is designed to be in the range of approximately 1.2 nanometers to 3.5 nanometers.

The first nonmagnetic coupling layer 14B_1 constituting the first ferromagnetic layer group 14 is composed of Ru, Ir, Rh, Cr, Cu, and alloys containing these, and it is particularly preferable to use Ru or Ir. The film thickness is designed so that the magnetizations of the (1-1)th ferromagnetic layer 14A_1 and the (1-2)th ferromagnetic layer 14A_2 are coupled in antiparallel directions. When using the RKKY interaction, the film thickness ranges from 0.5 nm to 1.1 nm, or from 1.7 nm to 2.5 nm for Ru and Ir. By configuring the first nonmagnetic coupling layer 14B_1 with the above-mentioned materials, the magnetization of the (1-1)th ferromagnetic layer 14A_1 and the magnetization of the (1-2)th ferromagnetic layer 14A_2 can be coupled in antiparallel directions. As a result, the superparamagnetic tunnel junction element 10 having excellent operational stability (robustness) against an external magnetic field can be realized according to the principle explained above.

The ratio of the minor axis L1 to the major axis L2 of the first ferromagnetic layer group 14 (aspect ratio: L2/L1) is preferably approximately 1 to 3. Due to this, low magnetic anisotropy and properties suitable for realizing a superparamagnetic state. In addition, the minor axis L1 is preferably 100 nm or less, more preferably 80 nm or less. Although there is no particular lower limit for L1, the lower limit is approximately 10 nanometers with the current technology from the viewpoint of microfabrication accuracy. The shape of the first ferromagnetic layer group 14 may be rectangular, rhombic, and the like, other than the elliptical shape shown in FIG. 2. In this case, the minor axis L1 and the major axis L2 are defined as lengths in the short direction and the long direction.

The shapes of the barrier layer 13 and the second ferromagnetic layer group 12 may be the same as or different from the first ferromagnetic layer group 14. Forming them in the same shape simplifies the manufacturing process. On the other hand, if the barrier layer 13 and the second ferromagnetic layer group 12 are formed larger than the first ferromagnetic layer group 14, the number of manufacturing steps increases. However, there is an advantage that the influence on the first ferromagnetic layer group 14, of the magnetic field leaking from the second ferromagnetic layer group 12 can be reduced. Here, the structure (FIG. 2) in which the second ferromagnetic layer group 12 is formed on the substrate side with respect to the first ferromagnetic layer group 14 is assumed.

5. Example

Next, the results of experiments conducted by the inventors on the superparamagnetic tunnel junction element 10 according to the first embodiment of the present invention will be shown. The inventors manufactured a superparamagnetic tunnel junction element 10 having the following film structure.

Si substrate with thermal oxide film/Ta(5)/PtMn(20)/Co (2.4)/Ru(0.85)/CoFeB(2.4)/MgO(1.0)/CoFeB(1.8)/Ru (0.74)/Co FeB(2.1)/Ta(5)/Ru(5)/Ta(50)

Here, the numbers in parentheses represent the film thickness, and the unit is nanometers.

The composition of PtMn is $Pt_{38}$—$Mn_{62}$, and the composition of CoFeB is $(Co_{75}$—$Fe_{25})_{75}$—$B_{25}$ (numbers are atomic %). Ta(5) on the substrate side corresponds to the lower electrode 11, PtMn/Co/Ru/CoFeB corresponds to the second ferromagnetic layer group 12, MgO(1.0) corresponds to the barrier layer 13, CoFeB(1.8) corresponds to the (1-1)th ferromagnetic layer 14A_1, Ru(0.74) corresponds to the first nonmagnetic coupling layer 14B_1, CoFeB(2.1) corresponds to the (1-2)th ferromagnetic layer 14A_2, and Ta(5)/Ru(5)/Ta(50) corresponds to the upper electrode 15. Note that the reason why the film thicknesses of the (1-1)th ferromagnetic layer 14A_1 and the (1-2)th ferromagnetic layer 14A_2 are different is because a magnetic dead layer due to the formation of the Ta layer of the upper electrode 15 is taken into consideration. The layers other than the MgO layer were deposited by DC magnetron sputtering, and the MgO layer was deposited by RF magnetron sputtering.

After the laminated film was deposited, microfabrication was performed using lithography technology. The second ferromagnetic layer group 12 to the first ferromagnetic layer group 14 were patterned all at once in substantially the same shape. Typical experimental results are shown below, and the same properties were confirmed in the range where the minor axis L1 was from 40 nm to 70 nm, the major axis L2 was from 60 nm to 110 nm, and the aspect ratio was from 1.1 to 1.7.

After microfabrication, heat treatment was performed at 300 degrees for 2 hours while applying an in-plane magnetic field of 1.2 tesla. The purpose of this heat treatment is to induce an exchange bias at the interface between PtMn and Co in the second ferromagnetic layer group 12.

Figure 6:
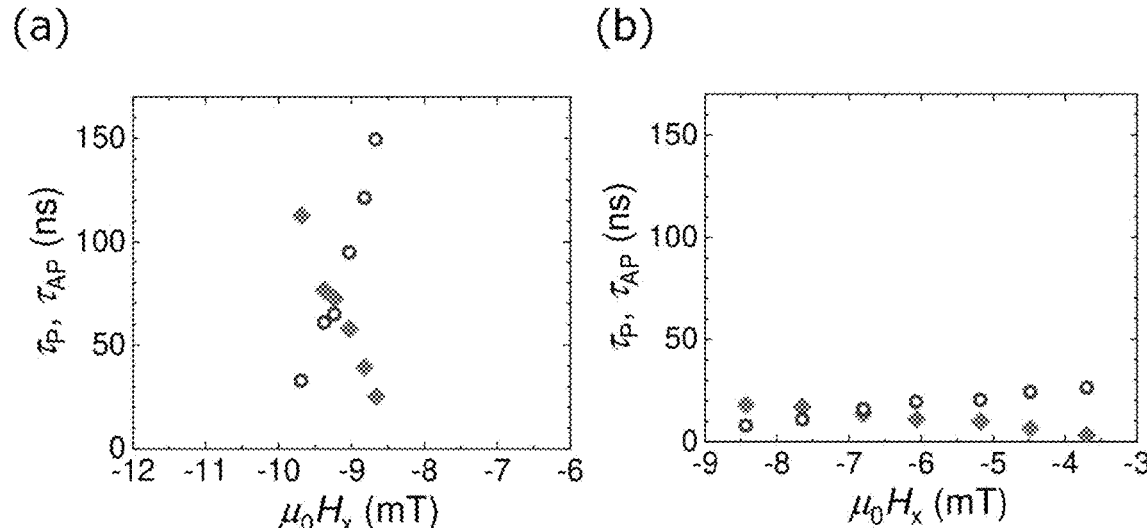
FIG. 6 is a graph showing the measurement results of the response of (a) the conventional superparamagnetic tunnel junction element shown in FIGS. 5(*a*), and (*b*) the superparamagnetic tunnel junction element of the first embodiment of the present invention when a magnetic field is applied in the direction of the easy axis of magnetization.

FIG. 6 shows the measurement results of changes in the typical value (time constant) $\tau_P$ (filled plot) of the time in which the magnetizations of the first ferromagnetic layer group 14 and the second ferromagnetic layer group 12 retain in the parallel direction and the typical value (time constant) $\tau_{AP}$ (outlined plot) of the time in which the magnetizations retain in the antiparallel direction when a magnetic field is applied in the direction of the easy axis of magnetization (major axis direction/x direction of the ellipse) of the fabricated superparamagnetic tunnel junction element 10. FIG. 6(*a*) shows the measurement results in the structure in which the conventional first ferromagnetic layer group 14 is composed of a single ferromagnetic layer, and FIG. 6(*b*) shows the measurement results in the structure in which the first ferromagnetic layer group 14 is composed of two ferromagnetic layers coupled antiferromagnetically. As is clear from the figure, in the conventional structure, the retention time in the parallel state and antiparallel state with respect to a magnetic field of approximately 1 millitesla changes in the range of approximately 10 nanoseconds to 150 nanoseconds. In contrast, in the structure of the present invention, even when a magnetic field of approximately 5 millitesla is applied, the retention time changes only within the range of several nanoseconds to approximately 20 nanoseconds, which confirms the effects of the present invention.

Figure 7:
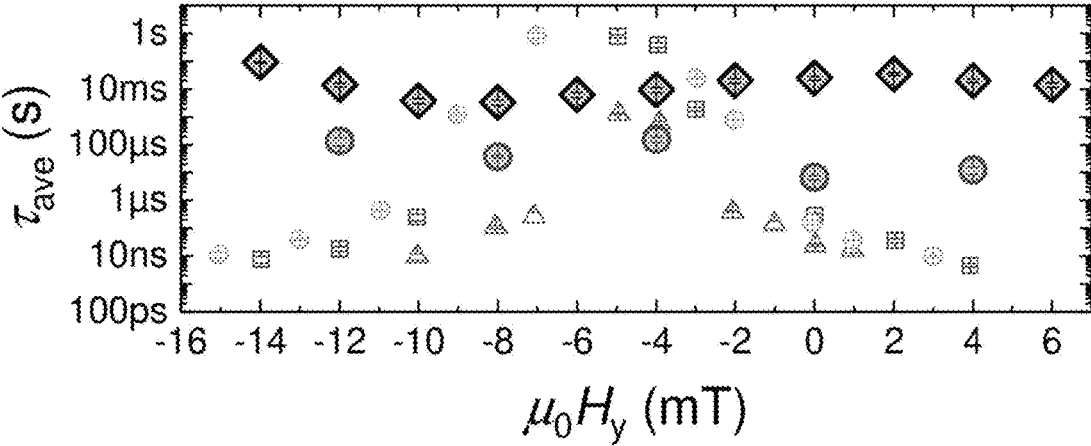
FIG. 7 is a graph showing the measurement results of the response of the superparamagnetic tunnel junction element of the first embodiment of the present invention (filled plot) and the superparamagnetic tunnel junction element of the conventional structure (outlined plot) when a magnetic field is applied in the direction of the hard axis of magnetization.

Next, FIG. 7 shows the measurement results of changes in the time constant of magnetization reversal of the superparamagnetic tunnel junction element 10 when a magnetic field is applied in the direction of the hard magnetization axis in the film plane (minor axis direction/y direction of the ellipse). Note that here, the time constant $\tau_{ave}$ on the vertical axis is defined as $\tau_{ave}=(\tau_P \times \tau_{AP})^{1/2}$, and corresponds to the first time constant $\tau 1$ of fluctuation of the fabricated superparamagnetic tunnel junction element 10. In the figure, the conventional structure is shown as an outlined plot, and the structure of the present invention is shown as a thinly filled plot. In the conventional structure, the retention time changes by approximately 8 digits with respect to a magnetic field of several millitesla. In contrast, in the structure of the present invention, even when a magnetic field of approximately 10 millitesla is applied, the retention time changes only within the range of 1 to 2 digits, which confirms the effect of the present invention.

Next, based on the obtained experimental results shown in FIGS. 6 and 7, a theoretical model that well describes the behavior of the first ferromagnetic layer group 14 was constructed, and the design guidelines for the first ferromagnetic layer group 14 for obtaining better properties were studied based on that theoretical model. As a result, it was found that the ratio between the magnetic volume (product of saturation magnetization $M_S$ and volume V) of the (1-1)th ferromagnetic layer 14A_1 and the (1-2)th ferromagnetic layer 14A_2, and the coupling strength between these two layers by the first nonmagnetic coupling layer 14B_1 determines the robustness against an external magnetic field, and that the smaller the magnetic volume and the larger the coupling strength, the better the robustness.

Specifically, it was found that, when the magnetic volume is expressed in the unit of $Tm^3$ [tesla cubic meter] and the coupling strength is expressed in the unit of T [tesla], sufficient robustness was obtained against an external magnetic field of approximately 2 mT when the magnetic volume [$Tm^3$]/coupling strength [T] was $2.5 \times 10^{-23}$ [$m^3$] or less, and sufficient robustness was obtained against an external magnetic field of approximately 5 mT when the ratio was below $1 \times 10^{-23}$ [$m^3$]. Note that here, the coupling strength between the two ferromagnetic layers by the first nonmagnetic coupling layer 14B_1 is given by a magnetic field (saturation magnetic field) in which the magnetizations of the two layers are oriented in one direction in the magnetization curve.

Considering the current shielding technology, if it is robust against magnetic field disturbance of approximately 2 mT, it can be used in consumer applications, and if it is robust against magnetic field disturbance of approximately 5 mT, it can be used in harsher environments such as in cars. From this, in the first ferromagnetic layer group 14, the value obtained by dividing the average magnetic volume [$Tm^3$] of the (1-1)th ferromagnetic layer 14A_1 and the (1-2)th ferromagnetic layer 14A_2 by the coupling strength [T] by the first nonmagnetic coupling layer 14B_1 is preferably 2.5× $10^{-23}$ [$m^3$] or less, more preferably 1×$10^{-23}$ [$m^3$] or less.

In addition, it was found that if the coupling strength [T] by the first nonmagnetic coupling layer 14B_1 is too large, the first time constant τ1 becomes long and the calculation time $T_{COMP}$ takes a long time. Detailed calculations have revealed that such adverse effects become worse when the coupling strength is 1 [T] or more. That is, it is preferable that the coupling strength [T] by the first nonmagnetic coupling layer 14B_1 is 1 tesla or less.

6. Modification (Three-Terminal Structure)

Figures 8, 9:
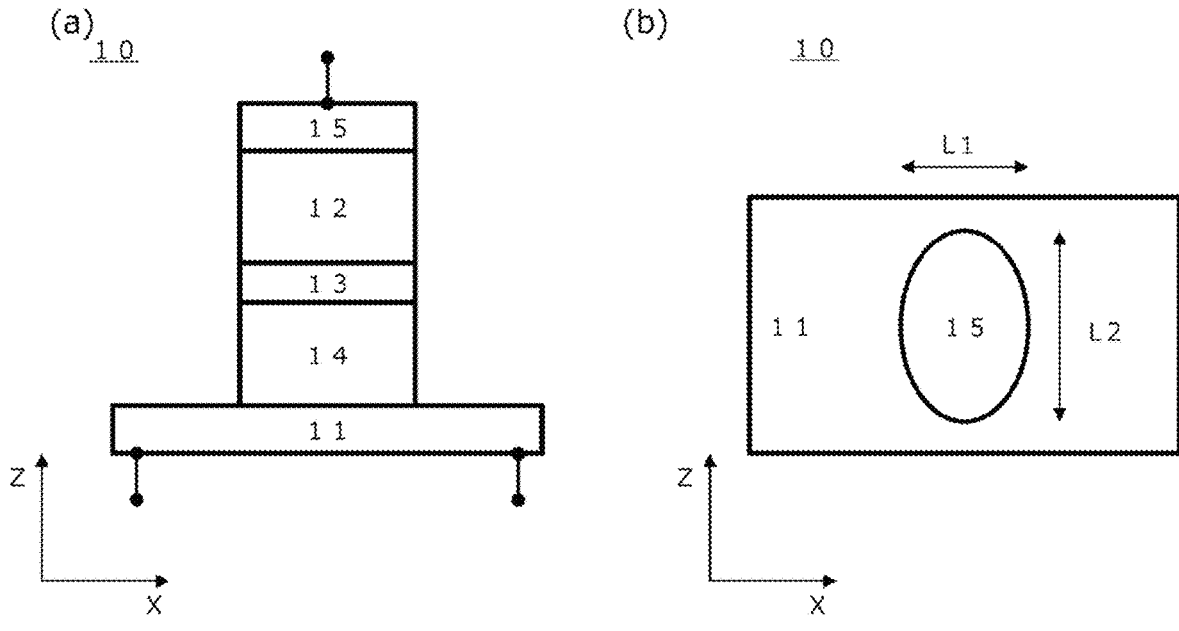
FIG. 8 includes (a) an X-Z sectional view and (b) an X-Y plan view schematically showing the structure of a modification of the superparamagnetic tunnel junction element of the first embodiment of the present invention.
FIG. 9 is an X-Z sectional view of a superparamagnetic tunnel junction element according to a second embodiment of the present invention.

FIG. 8 shows a structure of a modification of the superparamagnetic tunnel junction element 10 according to the first embodiment of the present invention. FIG. 8($a$) is an X-Z sectional view, and FIG. 8($b$) is an X-Y plan view. Unlike the superparamagnetic tunnel junction element 10 shown in FIG. 2, the superparamagnetic tunnel junction element 10 shown in FIG. 8 has three terminals, in which two terminals are connected to the lower electrode 11 and the remaining one terminal is connected to the upper electrode 15. Further, the first ferromagnetic layer group 14 is formed on the upper surface of the lower electrode 11, and the second ferromagnetic layer group 12 is formed on the lower surface of the upper electrode 15.

In the superparamagnetic tunnel junction element 10 of this modification, a spin orbit torque (SOT) generated by an in-plane current introduced into the lower electrode 11 is used in the first ferromagnetic layer group 14. Examples of the source generating the spin orbit torque include spin hall effects, anomalous hall effects, topological hall effects, Rashba-Edelstein effects, and magnetic spin hall effects. The circuit configuration of the random number generation unit 100 using the three-terminal superparamagnetic tunnel junction element 10 is disclosed in Non-Patent Literature 1, and the explanation thereof will be omitted here.

Also in this modification, the first ferromagnetic layer group 14 has a structure in which the (1-1)th ferromagnetic layer 14A_1 and the (1-2)th ferromagnetic layer 14A_2 face each other via the first nonmagnetic coupling layer 14B_1. In this case as well, the output signal $V_{OUT}$ from the random number generation unit 100 can be changed according to the input signal $V_{IN}$ by the spin orbit torque, and a computing system specialized for probabilistic computing can be realized. Furthermore, an artificial antiferromagnetic coupling provides robust properties against an external magnetic field.

In this case, it is desirable to use a material that can generate a large spin orbit torque for the lower electrode 11. Specifically, 5d transition metals such as Ta, W, Hf, Pt, and Bi, and alloys containing them are exemplified.

7. Basic Structure of Superparamagnetic Tunnel Junction (Second Embodiment)

Next, a superparamagnetic tunnel junction element 10 according to a second embodiment of the present invention will be explained. The difference between the second embodiment and the first embodiment is that in the first embodiment, the magnetization directions of the ferromagnetic layers constituting the second ferromagnetic layer group 12 are substantially fixed, whereas in the second embodiment, the magnetization directions of the ferromagnetic layers constituting the second ferromagnetic layer group 12 are not fixed, and it is designed such that the magnetization of at least a portion of the ferromagnetic layers fluctuates with a second time constant τ2. Further, it is desirable that this second time constant τ2 is 1 second or less. Further, it is desirable that the time correlation between the fluctuations in the magnetization of the first ferromagnetic layer group 14 and the fluctuations in the magnetization of the second ferromagnetic layer group 12 be small.

FIG. 9 is an X-Z sectional view schematically showing a typical structure of the superparamagnetic tunnel junction element 10 according to the second embodiment of the present invention. In the second embodiment, the second ferromagnetic layer group 12 has a structure in which a (2-1)th ferromagnetic layer 12A_1, a second nonmagnetic coupling layer 12B_1, and a (2-2)th ferromagnetic layer group 12A_2 are laminated. The (2-1)th ferromagnetic layer 12A_1 is adjacent to the barrier layer 13, and its magnetization direction needs to fluctuate with the second time constant τ2. As in the case of the (1-1)th ferromagnetic layer 14A_1, the first nonmagnetic coupling layer 14B_1, and the (1-2)th ferromagnetic layer group 14A_2 explained in the first embodiment, the (2-1)th ferromagnetic layer 12A_1 and the (2-2)th ferromagnetic layer group 12A_2 are antiferromagnetically coupled via the second nonmagnetic coupling layer 12B_1. Materials and structures that can be used for the (2-1)th ferromagnetic layer 12A_1, the second nonmagnetic coupling layer 12B_1, and the (2-2)th ferromagnetic layer group 12A_2 are the same as those of the (1-1)th ferromagnetic layer 14A_1, the first nonmagnetic coupling Since the layer 14B_1 and the (1-2)th ferromagnetic layer group 14A_2, and the explanation thereof will be omitted.

In the second embodiment, the state of the second ferromagnetic layer group 12 also constantly fluctuates by heat with the second time constant τ1. In this case, however, since the correlation with fluctuation of the first ferromagnetic layer group 11 is small, the tunnel magnetoresistance of the superparamagnetic tunnel junction element 10 changes with a time constant approximately equal to the first time constant τ1 and the second time constant τ2. The superparamagnetic tunnel junction element 10 of the second embodiment of the present invention can also be incorporated into the random number generation unit 100.

In the second ferromagnetic layer group 12 in the second embodiment, robust operations against an external magnetic field are realized by the same principle as explained for the first ferromagnetic layer group 14 in the first embodiment.

Non-Patent Literature 11 describes the usefulness for probabilistic computing, of a superparamagnetic tunnel junction element in which both ferromagnetic layers on both sides of the barrier layer 13 exhibit superparamagnetism. In addition, in the laminated structure assumed in Non-Patent Literature 11, since artificial antiferromagnetic coupling is not used, magnetostatic coupling (dipole interaction) between two ferromagnetic layer groups adversely affects the operation. However, in the superparamagnetic tunnel junction element 10 of the second embodiment of the present invention shown in FIG. 9, since the magnetizations of both the first ferromagnetic layer group 14 and the second ferromagnetic layer group 12 are substantially canceled by the plurality of ferromagnetic layers, the static magnetic field generated outside is small. Therefore, the influence of the dipole interaction is greatly reduced, and faster random number generation and more stable operations than the structure assumed in Non-Patent Literature 11 are expected.

Actually, the present invention can be implemented even if the second ferromagnetic layer group 12 has a structure consisting only of the (2-1)th ferromagnetic layer 12A_1.

The superparamagnetic tunnel junction element and random number generation unit according to the present invention can also be used for applications other than computing systems specialized for probabilistic computing. For example, it may be used as a random number generator for encryption.

REFERENCE SIGNS LIST

1: Computing system
10: Superparamagnetic tunnel junction element
11: Lower electrode
12: Second ferromagnetic layer group
12A_1: (2-1)th ferromagnetic layer
12A_2: (2-2)th ferromagnetic layer
12B_1: Second nonmagnetic coupling layer
13: Barrier layer
14: First ferromagnetic layer group
14A_1: (1-1)th ferromagnetic layer
14A_2: (1-2)th ferromagnetic layer
14B_1: First nonmagnetic coupling layer
15: Upper electrode
100: Random number generation unit
200: Weighed logic
300: Output circuit

What is claimed is:

1. A superparamagnetic tunnel junction element comprising:
a first ferromagnetic layer group containing a ferromagnetic material;
a second ferromagnetic layer group containing a ferromagnetic material; and
a barrier layer disposed between the first ferromagnetic layer group and the second ferromagnetic layer group, wherein
the first ferromagnetic layer group has a (1-1)th ferromagnetic layer, a first nonmagnetic coupling layer, and a (1-2)th ferromagnetic layer,
the (1-1)th ferromagnetic layer is made of a ferromagnetic material, and a magnetization direction of the (1-1)th ferromagnetic layer fluctuates with a first time constant, and the first time constant is 1 second or less, and
the first nonmagnetic coupling layer contains at least one of Ru, Ir, Rh, Cr and Cu.

2. The superparamagnetic tunnel junction element according to claim 1, wherein
the second ferromagnetic layer group has at least a (2-1)th ferromagnetic layer, the (2-1)th ferromagnetic layer is made of a ferromagnetic material, and a magnetization direction thereof is substantially fixed.

3. The superparamagnetic tunnel junction element according to claim 1, wherein
the second ferromagnetic layer group has at least a (2-1)th ferromagnetic layer, the (2-1)th ferromagnetic layer is made of a ferromagnetic material, a magnetization direction of the (2-1)th ferromagnetic layer fluctuates with a second time constant, and the second time constant is 1 second or less.

4. The superparamagnetic tunnel junction element according to claim 3, wherein
the second ferromagnetic layer group further has a second nonmagnetic coupling layer and a (2-2)th ferromagnetic layer, and the second nonmagnetic coupling layer contains at least one of Ru, Ir, Rh, Cr, and Cu.

5. The superparamagnetic tunnel junction element according to claim 3, wherein
the second ferromagnetic layer group further has a second nonmagnetic coupling layer and a (2-2)th ferromagnetic layer, and the magnetizations of the (2-1)th ferromagnetic layer and the (2-2)th ferromagnetic layer are coupled by the second nonmagnetic coupling layer so as to be stable in approximately antiparallel directions.

6. The superparamagnetic tunnel junction element according to claim 1, wherein
a film thickness of the first nonmagnetic coupling layer is in a range of 0.5 nm to 1.1 nm or 1.7 nm to 2.5 nm.

7. The superparamagnetic tunnel junction element according to claim 1, wherein
the first ferromagnetic layer group has a circular or elliptical shape, a ratio of a major axis to a minor axis is 1 or more and 3 or less, and the minor axis is 80 nanometers or less.

8. The superparamagnetic tunnel junction element according to claim 1, wherein
a value obtained by dividing an average magnetic volume [tesla cubic meter] of the (1-1)th ferromagnetic layer and the (1-2)th ferromagnetic layer by a coupling strength [tesla] of the first nonmagnetic coupling layer is $2.5 \times 10^{-23}$ [cubic meters] or less, and the coupling strength [tesla] of the first nonmagnetic coupling layer is 1 [tesla] or less.

9. A computing system comprising:
a weighed logic;
a plurality of random number generation units connected by the weighed logic; and
an output circuit, wherein
each random number generation unit has the superparamagnetic tunnel junction element according to claim 1.

10. A superparamagnetic tunnel junction element comprising:
a first ferromagnetic layer group containing a ferromagnetic material;
a second ferromagnetic layer group containing a ferromagnetic material; and
a barrier layer disposed between the first ferromagnetic layer group and the second ferromagnetic layer group;
the first ferromagnetic layer group has a (1-1)th ferromagnetic layer, a first nonmagnetic coupling layer, and a (1-2)th ferromagnetic layer,
the (1-1)th ferromagnetic layer is made of a ferromagnetic material, a magnetization direction of the (1-1)th ferromagnetic layer fluctuates with a first time constant, the first time constant is 1 second or less, and
the magnetizations of the (1-1)th ferromagnetic layer and the (1-2)th ferromagnetic layer are coupled by the first nonmagnetic coupling layer so as to be stable in approximately antiparallel directions.

* * * * *